United States Patent [19]
Brauns

[11] Patent Number: 5,442,324
[45] Date of Patent: Aug. 15, 1995

[54] DIGITAL-CONTROLLED OSCILLATOR

[75] Inventor: Gregory T. Brauns, Whitehall Township, Lehigh County, Pa.

[73] Assignee: AT&T Corp., Murray Hill, N.J.

[21] Appl. No.: 311,625

[22] Filed: Sep. 23, 1994

[51] Int. Cl.$^6$ .................... H03B 28/00; H03L 7/085;
                                    H03L 7/099
[52] U.S. Cl. .................... 331/34; 331/1 A;
        331/25; 331/50; 331/179; 327/159
[58] Field of Search ............ 331/1 A, 16, 17, 25,
        331/34, 46, 50, 55, 144, 145, 172, 177 R, 179;
                                                327/159

[56]        References Cited
         U.S. PATENT DOCUMENTS
    4,001,716  1/1977  Swanson et al. ............ 331/145 X

OTHER PUBLICATIONS

Letter dated May 10, 1993, addressed to Siemens AG from Karl–Heinz Orehovsky, 3 pages with English translation.

"Phase–Locked Loops, Theory Design, & Applications", by Dr. Roland E. Best, Assistant Vice President, Engineering, Sandoz AG, Basel, Switzerland, available from McGraw–Hill Book Company, New York, copyright 1984, chapter 4, pp. 69–110.

*Primary Examiner*—David Mis
*Attorney, Agent, or Firm*—Howard A. Skaist

[57]        ABSTRACT

Briefly, in accordance with one embodiment of the invention, an electrical circuit comprises: a digital-controlled oscillator. The digital-controlled oscillator includes an edge delay oscillator being adapted to produce digital oscillator pulses in response to digital clock pulses, each of the oscillator pulses having a rising edge and a falling edge. The edge delay oscillator is further adapted to delay at least one of the oscillator pulse edges in response to a delay signal. In accordance with another embodiment of the invention, an electrical circuit comprises: a digital-controlled oscillator, the oscillator including a clock having a substantially predetermined frequency. The oscillator is adapted to produce a digital output signal comprising a series of digital output pulses. The oscillator is further adapted to modify the digital output signal so that at least one digital output pulse is adjusted in phase relative to the immediately preceding digital output pulse by approximately one-half period of the substantially predetermined frequency. In accordance with yet another embodiment of the invention, a method of reducing the phase-quantization for a digital output signal comprises the steps of: producing a first series of digital pulses at a substantially predetermined frequency, each of the first series digital pulses having a rising edge and a falling edge; producing a second series of digital pulses at the substantially predetermined frequency, each of the second series digital pulses having a rising edge and a falling edge, the second series being out of phase with respect to the first series, one of the edges of at least one of the digital pulses in the second series being delayed by approximately at least one-half period of the substantially predetermined frequency; and combining the second series including the at least one edge-delayed pulse with the first series to thereby provide the digital output signal having reduced phase quantization.

20 Claims, 5 Drawing Sheets

FIG. 8
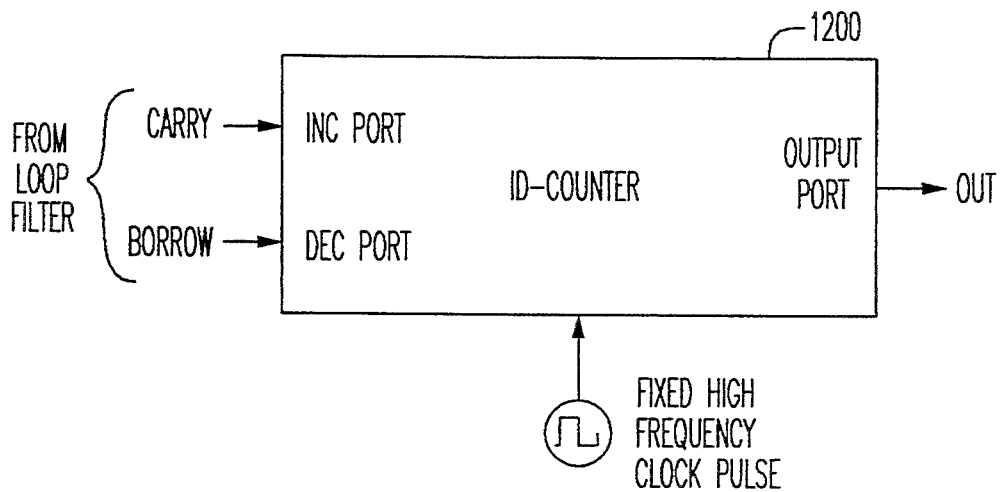
FIG. 9
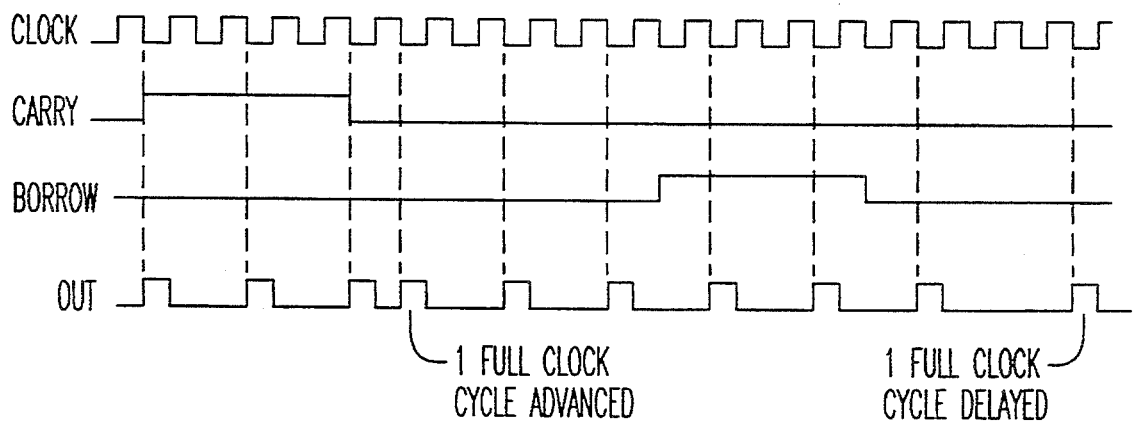
FIG. 10
EDGE-DELAY TRUTH TABLE
|  | INCREMENT/CARRY | DECREMENT/BORROW |
| --- | --- | --- |
| Q1 LEADS Q0 | SDQ0/DELAY FALLING EDGE | SDQ1/DELAY RISING EDGE |
| Q0 LEADS Q1 | SDQ1/DELAY FALLING EDGE | SDQ0/DELAY RISING EDGE |

DIGITAL-CONTROLLED OSCILLATOR

TECHNICAL FIELD

This invention relates to oscillators and, more particularly, to a digital-signal controlled or digital-controlled oscillator.

BACKGROUND OF THE INVENTION

Conventional oscillators and, in particular, digital-controlled oscillators (DCOs) are limited in their ability to introduce a phase adjustment smaller than the period of the reference clock in the oscillator. Thus, the reference clock period provides a quantization limit on the time precision of a phase-locked loop (PLL) that incorporates the DCO. Typically, to achieve greater precision would require increasing the frequency of the reference clock in the oscillator, although this approach has many associated problems. In such an approach, a higher frequency clock may be supplied or, alternatively, circuitry may be introduced to increase the clock frequency. However, such an increase in the frequency of the reference clock may increase the cost and complexity of the supporting or other circuitry and increase the power consumption of the oscillator. Likewise, increasing the frequency may, in some circumstances, not be a viable option for technological reasons. Thus, a need exists for an oscillator having the capability to introduce a phase adjustment smaller than the period of the reference clock in the oscillator.

SUMMARY OF THE INVENTION

Briefly, in accordance with one embodiment of the invention, an electrical circuit comprises: a digital-controlled oscillator. The digital-controlled oscillator includes an edge delay oscillator being adapted to produce digital oscillator pulses in response to digital clock pulses, each of the oscillator pulses having a rising edge and a falling edge. The edge delay oscillator is further adapted to delay at least one of the oscillator pulse edges in response to a delay signal. In accordance with another embodiment of the invention, an electrical circuit comprises: a digital-controlled oscillator, the oscillator including a clock having a substantially predetermined frequency. The oscillator is adapted to produce a digital output signal comprising a series of digital output pulses. The oscillator is further adapted to modify the digital output pulse so that at least one digital output signal is adjusted in phase relative to the immediately preceding digital output pulse by approximately one-half period of the substantially predetermined frequency. In accordance with yet another embodiment of the invention, a method of reducing the phase quantization for a digital output signal comprises the steps of: producing a first series of digital pulses at a substantially predetermined frequency, each of the first series digital pulses having a rising edge and a falling edge; producing a second series of digital pulses at the substantially predetermined frequency, each of the second series digital pulses having a rising edge and a falling edge, the second series being out of phase with respect to the first series, one of the edges of at least one of the digital pulses in the second series being delayed by substantially at least one-half period of the substantially predetermined frequency; and combining the second series including the at least one edge-delayed pulse with the first series to thereby provide the digital output signal having reduced phase quantization.

BRIEF DESCRIPTION OF THE DRAWINGS

The subject matter regarded as the invention is particularly pointed out and distinctly claimed in the concluding portion of this specification. The invention, however, both as to organization and method of operation, together with objects, features, and advantages thereof, may best be understood by reference to the following detailed description when read with the accompanying drawings in which:

FIG. 8 is an embodiment of a conventional increment-decrement counter DCO.

FIG. 9 is a timing diagram illustrating series of digital pulses that may be associated with the embodiment of an increment-decrement counter DCO illustrated in FIG. 8.

FIG. 10 is a truth-table diagram illustrating the relationship between a digital delay signal and the desired phase adjustment for an embodiment of a DCO in accordance with the invention.

DETAILED DESCRIPTION

Figure 2:
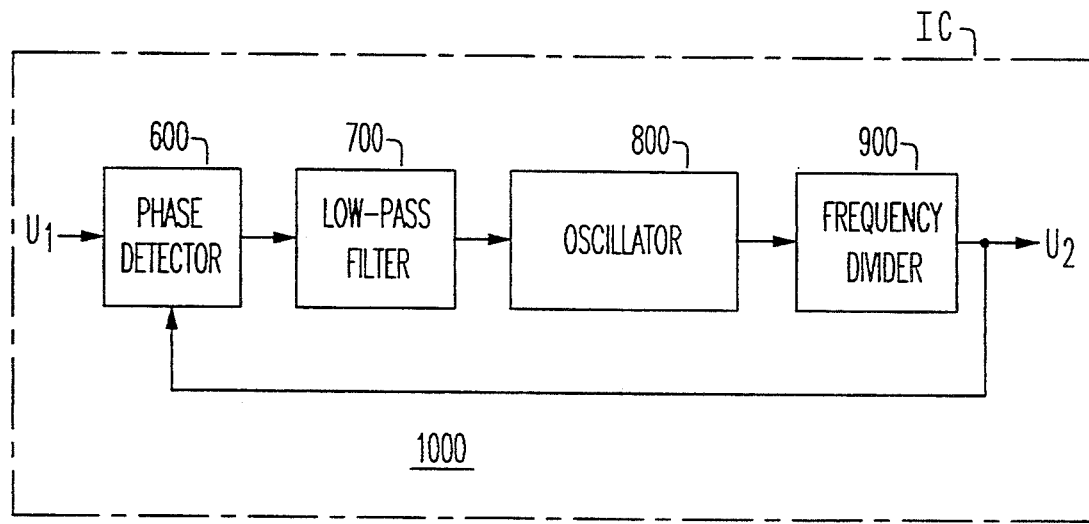
FIG. 2 is a block diagram illustrating one embodiment of a phase-locked loop (PLL) that may incorporate an embodiment of a DCO in accordance with the invention.

FIG. 2 illustrates an embodiment of an all digital phase-locked loop (DPLL) having a generic first-order loop structure. Although not required, such a DPLL may be embodied on a single integrated circuit (IC) chip, as illustrated schematically in FIG. 2. DPLL 1000 includes phase detector 600, low-pass filter 700, oscillator 800, and frequency divider 900. As further illustrated in FIG. 2, phase detector 600 senses the phase difference between input signal U₁ and output signal U₂. For the DPLL illustrated in FIG. 2, phase detector 600 may comprise a phase detector or a "type 4" detector, such as described, for example, in *Phase-Locked Loops: Theory, Design and Applications* written by Roland Best, and available from McGraw-Hill Book Co. (1984), herein incorporated by reference. The acceptable phase offset or phase difference between U₁ and U₂ for satisfactory operation may be increased or extended. For example, the phase detector may include a frequency divider for each of its input signals, such as employed in the typical applications described in the aforementioned text. As illustrated, an error signal (not shown) derived from the phase difference between input signals U₁ and U₂ is accumulated and filtered. As for a conventional DPLL, this filtered error signal provides an indication to the oscillator clock to speed up or slow down so that the output signal tracks the input signal with a substantially predetermined closed loop frequency dependent gain.

One problem with an all-digital implementation of a PLL, such as illustrated in FIG. 2 above, is a limitation on the quantization step or size of the phase adjustment of output signal $U_2$. The minimum phase adjustment is limited or restricted to the period of the highest frequency signal in oscillator 800. Thus, in a conventional PLL, a conventional oscillator may prove undesirable where the maximum frequency of oscillation is not high enough to provide sufficiently small phase steps or adjustments to provide adequate phase or timing precision for the particular application or environment.

One technique for implementing a digital-controlled oscillator (DCO) is described on page 103 of the aforementioned text. This type of DCO is termed an "increment-decrement (ID) counter DCO." An embodiment 1200 of such a DCO is illustrated in FIG. 8. FIG. 9 is a timing diagram illustrating digital pulses that may be produced by DCO 1200. As illustrated, DCO 1200 obtains as input signals a series of regular or mutually timed clock pulses or signals at a substantially predetermined frequency. DCO 1200 also obtains either "carry" or "borrow" signals, typically obtained from a filter, such as, for example, low-pass filter 700 illustrated in FIG. 2. These signals provided to DCO 1200 and the resulting digital output pulses produced are illustrated in FIG. 9. A detailed analysis of the circuit illustrated in FIG. 8 may be obtained from "Digital Phase-Locked Loops move into Analog Territory," written by W. T. Greer, Jr., and Bill Kean, and appearing in *Electronic Design*, Mar. 31, 1982, herein incorporated by reference. For the circuit illustrated in FIG. 8, whenever a "carry" pulse (speed-up signal) is applied to the increment (inc) port, a clock cycle or clock pulse of the reference clock is advanced in phase in the series or sequence of digital output pulses by one cycle of the reference clock frequency. Likewise, whenever a "borrow" pulse (slow-down signal) is applied to the decrement (dec) port, a clock cycle or pulse is delayed in phase in the series or sequence of digital output pulses by one cycle of the reference clock frequency. Nominally, the output digital signal pulses appearing at the output port of DCO 1200 have a frequency approximately equal to half of the frequency of the reference clock. As previously described, a disadvantage of such a DCO is that the minimum phase adjustment is equal to one period of the reference clock.

Figure 1:
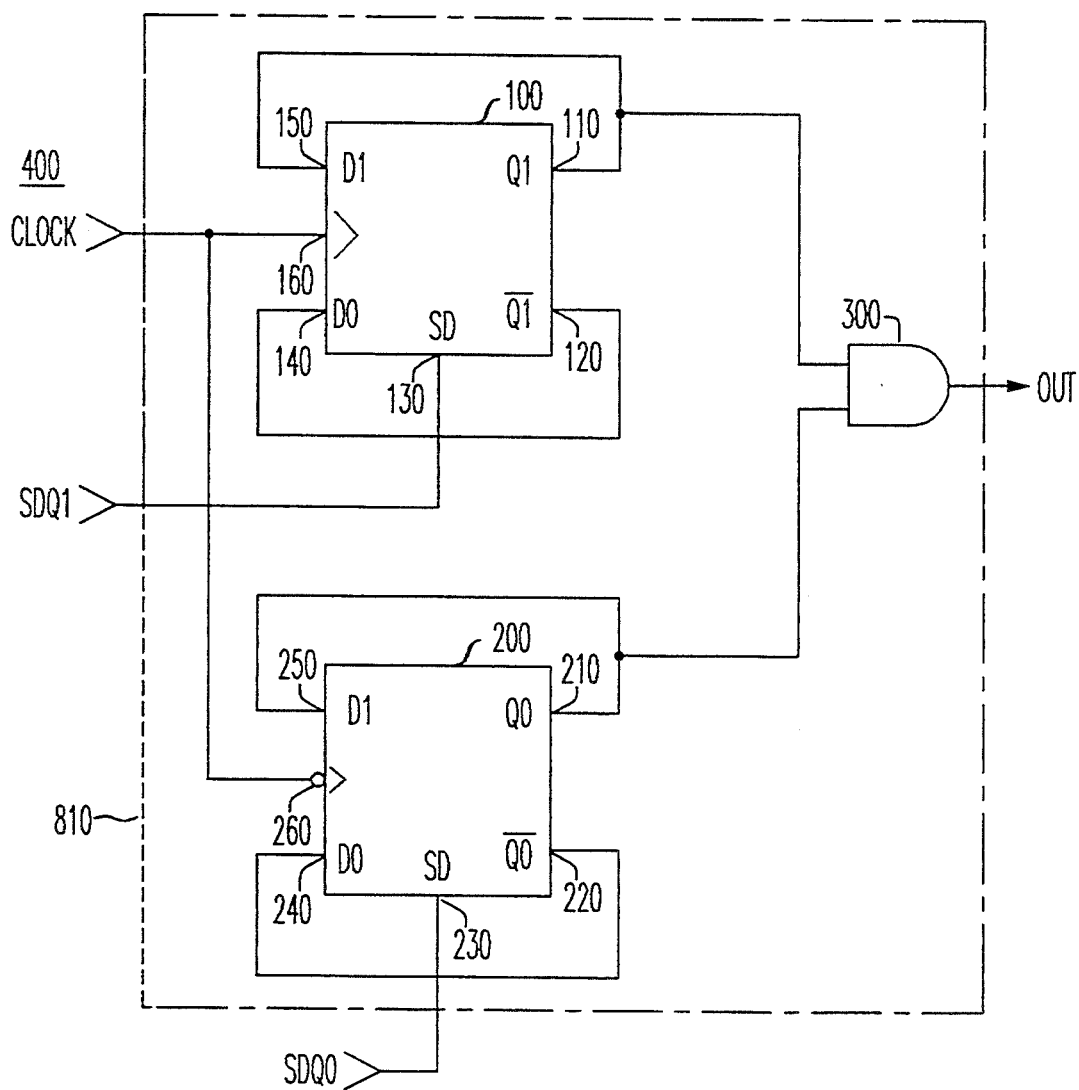
FIG. 1 is a schematic diagram illustrating one embodiment of a digital-controlled oscillator (DCO) in accordance with the invention.

FIG. 1 illustrates an embodiment of a DCO in accordance with the invention. A DCO in accordance with the invention, such as embodiment 810 illustrated in FIG. 1, uses both edges of the reference clock pulses to generate a digital output signal that may be phase adjusted or achieve a phase quantization precision down to one-half of a dock period of the reference clock. This technique thereby provides a factor of two frequency advantage over, for example, the embodiment illustrated in FIG. 8. For the embodiment illustrated in FIG. 1, DCO 810 also has a nominal output frequency equal to one-half of the reference clock frequency. Furthermore, input signals SDQ1 and SDQ0 respectively provided to ports 130 and 230 are used to signal an increment (speed-up) or decrement (slowdown) phase adjustment, as explained in more detail hereinafter. However, in contrast with the DCO illustrated in FIG. 8, the digital output signal phase quantization or phase adjustment achieved is one-half of the period of the reference clock frequency. It will, of course, be appreciated that while a DCO in accordance with the invention, such as embodiment 810, may be incorporated in a PLL, such as the PLL illustrated in FIG. 2, the scope of the invention is not limited in this respect. A DCO in accordance with the invention may be incorporated in any PLL, such as an analog PLL, and, furthermore, may be employed in systems or configurations other than in connection with a PLL.

Figure 3:
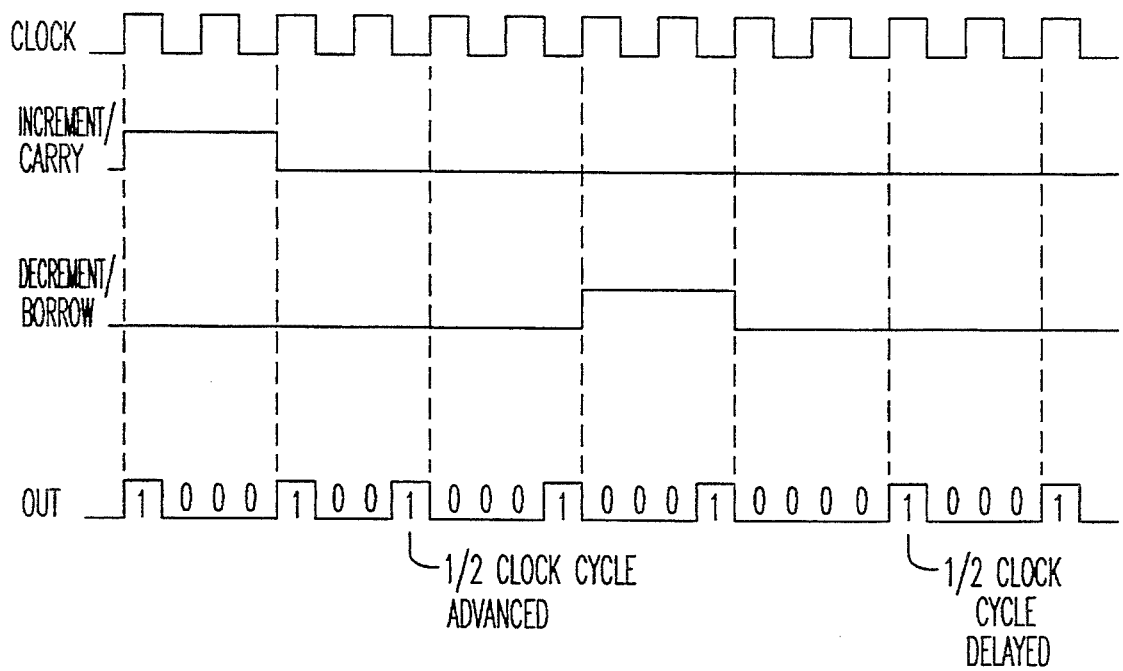
FIG. 3 is a timing diagram illustrating series of digital pulses that may be associated with an embodiment of a DCO in accordance with the invention.

FIG. 3 is a timing diagram illustrating a series of digital output pulses that may be produced by a DCO in accordance with the invention. As illustrated in FIG. 3, a reference clock signal is provided to the DCO. Likewise, as illustrated in FIG. 3, an increment signal may be provided or applied to the DCO or, alternatively, a decrement signal may be provided or applied to the DCO. The digital output pulses that result from such increment and decrement signals are likewise illustrated. When an increment signal is provided to a DCO in accordance with the invention, the digital output pulses that result comprise a series in which a clock pulse is advanced in phase by only one-quarter cycle of the output frequency or one-half cycle of the reference clock frequency in the series of output clock pulses. In contrast, for the conventional DCO illustrated in FIG. 8, the clock pulse is advanced by as much as one-half cycle of the output frequency or one cycle of the reference clock frequency for such an increment signal. Likewise, when a decrement signal is provided to a DCO in accordance with the invention, the digital output signal that results comprises a series of signal pulses in which a clock pulse is delayed in phase by only one-quarter cycle of the output frequency or one-half cycle of the reference clock frequency. In contrast, for the conventional DCO illustrated in FIG. 8, a clock pulse is delayed by as much as one-half cycle of the output frequency or one-cycle of the reference clock frequency for such a decrement signal.

The embodiment of a DCO in accordance with the invention illustrated in FIG. 1 includes an edge delayable rising-edge oscillator 100 and an edge delayable falling-edge oscillator 200. As will be explained in more detail hereinafter, oscillator 100 and oscillator 200 are adapted to produce digital oscillator pulses in response to digital clock signals, each of the oscillator pulses having a rising edge and a falling edge. In response to a digital delay signal, oscillator 100 is further adapted to delay at least one of the oscillator pulse edges triggered on a rising edge of the clock pulse provided. Likewise, oscillator 200 is adapted to delay at least one of the oscillator pulse edges triggered on a falling edge of the clock pulse provided, also in response to a digital delay signal. For convenience, therefore, in this context, these oscillators are referred to as "edge delay oscillators." In this particular embodiment, edge delay oscillator 100 comprises a rising-edge-triggered flip-flop including a data selector port 130. Likewise, edge delay oscillator 200, in this particular embodiment, comprises a falling-edge-triggered flip-flop with a data selector port 230. A digital pulse signal to accomplish or effect an oscillator pulse edge delay, as described in more detail hereinafter, may be provided to port 130 or 230.

Referring now to edge delay oscillator 100, the oscillator is responsive to a reference clock 400 (not shown) having the predetermined reference clock frequency. As illustrated in FIG. 1, this clock may be externally-derived and is coupled to edge delay oscillator 100 via clock signal port 160. Likewise, port 130 receives delay signal SDQ1, as illustrated in FIG. 1. Edge delay oscillator 100 is configured so that if signal SDQ1 is "low," the signal provided to port 140, also designated DO in FIG. 1, from port 120 is latched. In such a situation, in this particular embodiment, where signal SDQ1 provided to port 130 is low, the oscillator signal provided at port 110, designated Q1 in FIG. 1, is a series of digital clock pulses corresponding to the frequency of clock 400 divided by a factor of two, e.g., having approximately one-half the frequency of the reference clock. Likewise, again referring to edge delay oscillator 100, if the digital or binary signal provided to port 130 is "high," then the signal provided to port 150 from port 110 is latched. In such a situation, due to the configuration of edge delay oscillator 100 illustrated in FIG. 1, the oscillator pulse provided at output port 110 does not transition or change state from the immediately preceding digital oscillator pulse and, thus, a digital pulse edge to be triggered on the rising edge of a clock pulse from clock 400 is delayed if such a "digital delay signal" is provided to port 130. Of course, the invention is not restricted in scope to any particular convention with respect to the magnitude or polarity of a high voltage signal versus a low voltage signal and the conventions used in this embodiment are for purposes of illustration only.

The operation of edge delay oscillator 200 is similar to that of edge delay oscillator 100, although, as previously described, edge delay oscillator 200 is falling-edge-triggered rather than rising-edge-triggered. Thus, as previously described with respect to edge delay oscillator 100, if a low digital signal is provided to port 230 for signal SDQ0 then the digital signal or digital pulses provided at port 210 have a frequency corresponding to the frequency of the reference clock divided by a factor of 2. Likewise, if the signal provided to port 230 for SDQ0 is high, then the signal provided to port 250 from port 210 is latched and a digital pulse edge to be triggered on the falling edge of a clock pulse from clock 400 is delayed, rather than delaying the triggering of the digital pulse edge on the rising edge for oscillator 100. Furthermore, although the embodiment illustrated in FIG. 1 employs conventional "D-style" flip-flops in which the output pulse of the flip-flop changes state on only one edge of its output pulse, an alternative embodiment may include a flip-flop having the capability to change state on either edge of the flip-flop output pulse. Likewise, such an embodiment may be configured to employ only one edge delay oscillator rather than the two oscillators illustrated in FIG. 1.

As illustrated by the timing diagram of FIG. 3, one factor affecting the operation of a DCO in accordance with the invention is how to increment the phase adjustment or how to decrement the phase adjustment. However, in contrast with the conventional DCO illustrated in FIG. 8, for an embodiment of a DCO in accordance with the invention, such as the embodiment illustrated in FIG. 1, more complex digital signal considerations also arise. More particularly, for this particular embodiment, another consideration is the relative phase of the digital oscillator signals, designated Q1 and Q0, provided by edge delay oscillator 100 and edge delay oscillator 200 respectively. The aspect of this embodiment of a DCO in accordance with the invention is more readily appreciated by referring to AND gate 300 illustrated in FIG. 1. As illustrated, oscillator pulses are provided by edge delay oscillators 100 and 200. Likewise, these oscillator pulses are combined, as illustrated for this particular embodiment, by an AND gate, although the invention is, of course, not restricted in scope in this respect. Nonetheless, for this embodiment, as will be explained in more detail hereinafter, depending upon the phase relationship of signals Q1 and Q0 and depending upon the edge delayed for a digital pulse in one of these series of digital signals, a phase adjustment may be accomplished or executed for the digital output signal of DCO 810.

Figure 4:
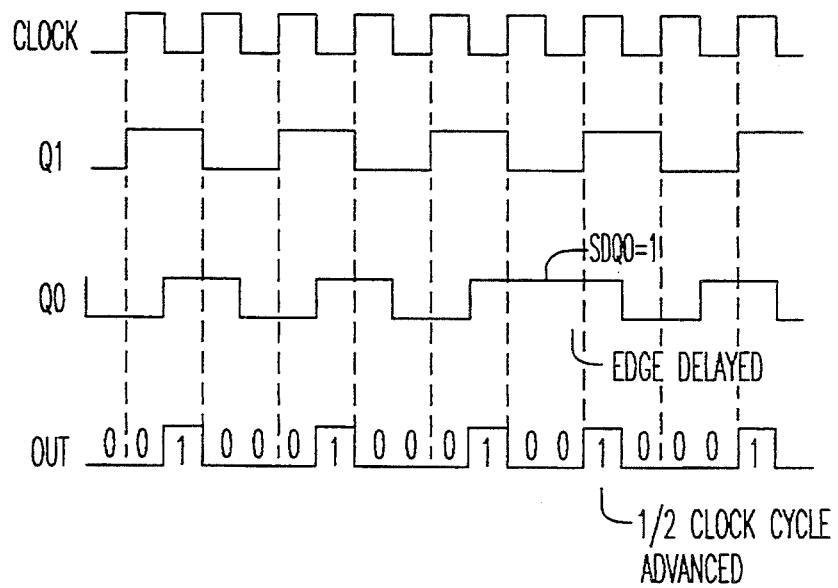
FIGS. 4–7 are timing diagrams illustrating other or alternative series of digital pulses that may be associated with an embodiment of a DCO in accordance with the invention.

The relationship between the desired phase adjustment to be accomplished and the relative phase of the digital signals produced by edge delay oscillators 100 and 200 for this particular embodiment are illustrated in FIGS. 4–7. For example, referring to FIG. 4, assuming it is desired to accomplish an increment of the phase adjustment, and, likewise, as illustrated in FIG. 4, where digital signal Q1 of oscillator 100 leads digital signal Q0 of oscillator 200 in phase, then as further illustrated in FIG. 4, it is desired to delay by one reference clock cycle a falling edge of digital signal Q0 produced by oscillator 200. As previously described, this may be accomplished by providing a "high" SDQ0 signal to port 230 of oscillator 200. As illustrated in FIG. 4, oscillator 200 triggers on the falling edge of the clock pulses produced by clock 400. Thus, the respective digital signals produced by oscillators 100 and 200 are "high" at the same time due at least in part to the delay in the falling edge of digital oscillator signal Q0. As illustrated by the series in FIG. 4 of digital output pulses of DCO 810, an increment signal provided to port 230 therefore results in a phase adjustment by advancing a clock pulse earlier in the output signal by onequarter cycle of the output signal frequency or one-half of a clock period of the reference clock frequency. It is also interesting to observe that after the edge delay as illustrated in FIG. 4, the relative phase of the digital signals provided by oscillator 100 and oscillator 200 has changed from digital signal Q1 of oscillator 100 leading digital signal Q0 of oscillator 200 to digital signal Q0 of oscillator 200 leading digital signal Q1 of oscillator 100.

Referring now to FIG. 5, again assuming an increment signal or an increment of the phase adjustment, FIG. 5 illustrates the situation where digital signal Q0 of oscillator 200 leads digital signal Q1 of oscillator 100 in phase. Thus, for this particular situation for the embodiment illustrated in FIG. 1, a high signal is provided to input port 130 of oscillator 100, in contrast with FIG. 4. In this case, although oscillator 100 is a rising-edge-triggered oscillator, this delays the falling edge of a digital pulse produced by oscillator 100 by one reference clock period. Again, referring to the embodiment illustrated in FIG. 1, this delay results in an earlier or advanced output pulse because the digital signals produced by oscillator 100 and oscillator 200 are "high" at the same time. Thus, as illustrated by the output signal produced by DCO 810, this again results in a phase adjustment by advancing a clock pulse in phase in the output signal by a one-quarter cycle of the output signal frequency or one-half of the period of the reference clock frequency.

Figure 5:
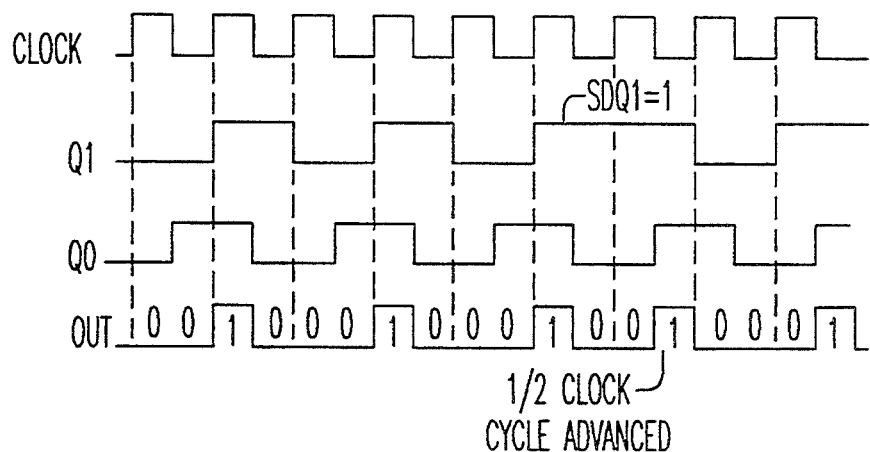
Figure 6:
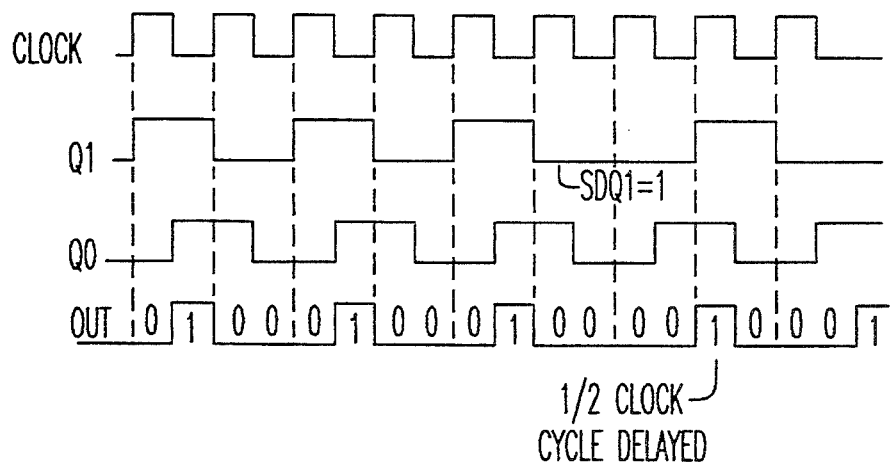
Figure 7:
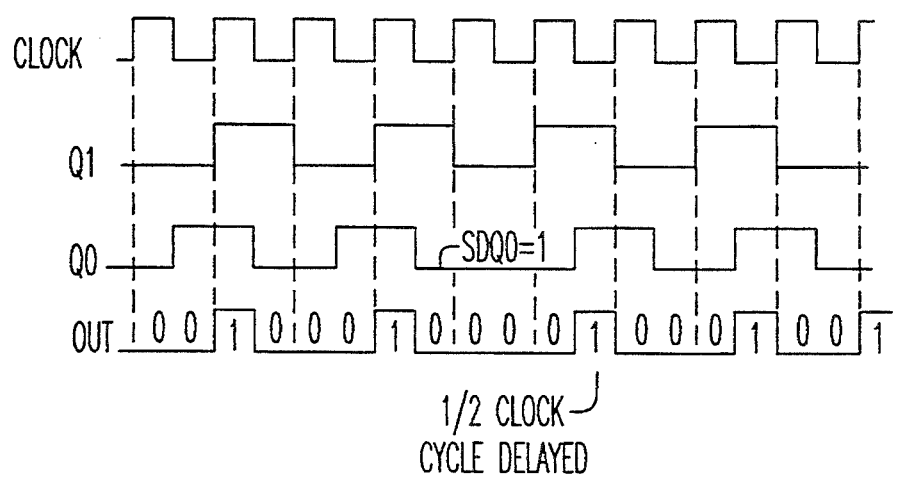

Referring now to FIG. 6, it is assumed for this particular figure that it is desired to reduce the phase as opposed to increasing it, so that a decrement signal is provided, in contrast with FIGS. 4 and 5. Likewise, as illustrated in FIG. 6, the digital signal produced by oscillator 100 leads the digital signal produced by oscillator 200 in phase. Thus, as illustrated, it is desired to delay a rising edge, which may be accomplished in this situation by providing a "high" digital signal to input port 130. Finally, referring now to FIG. 7, a situation where it is also desirable to reduce the phase and provide a decrement signal, but where the digital signal produced by oscillator 200 leads the digital signal produced by oscillator 100 in phase, a rising edge is delayed by providing a high signal to port 230 of oscillator 200 and thereby delay an edge of a pulse produced by the falling-edge-triggered oscillator.

FIG. 10 provides an edge-delay truth-table depicting the relationship illustrated by FIGS. 4-7. The table provides information regarding whether oscillator 100 or oscillator 200 receives a high signal in this particular embodiment depending on the relative phase of the digital signals produced by these oscillators and the direction of the phase adjustment, (i.e., increment or decrement). The table also indicates whether a rising or falling edge is being delayed. It is desirable to sense the phase relationship of the digital signals produced by oscillators 100 and 200 in addition to providing an increment or decrement signal to accomplish the desired phase adjustment. This phase relationship may be sensed a number of different ways, such as with a conventional latch or flip-flop, such as flip-flop 87 illustrated in FIG. 11, or with other digital or logic circuitry. It will, of course, be appreciated that the invention is not restricted in scope to the embodiment associated with this particular edge-delay truth table.

Figure 11:
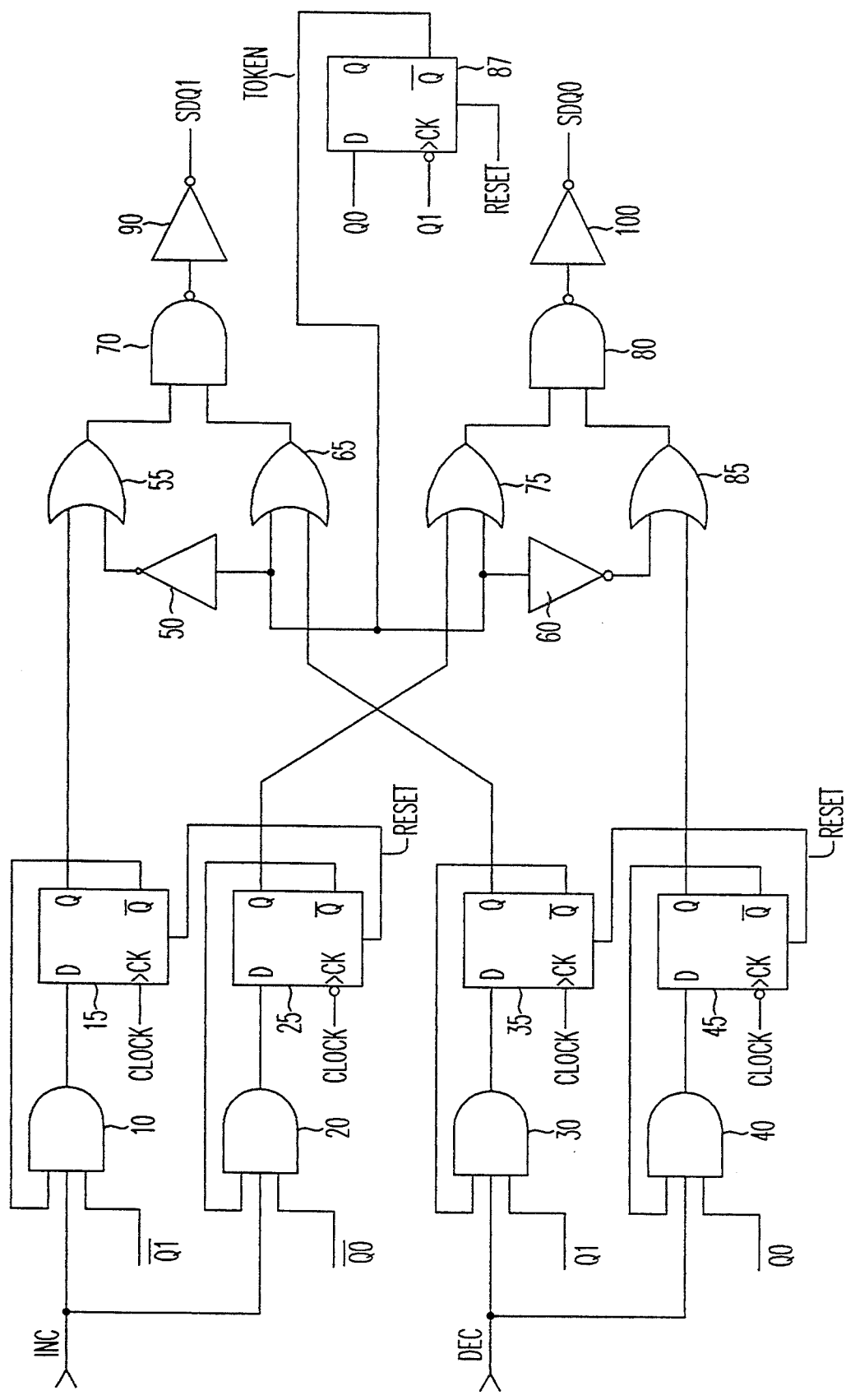
FIG. 11 is a circuit diagram illustrating an embodiment of a digital circuit for producing digital delay signals for controlling a DCO in accordance with the invention.

FIG. 11 is a circuit diagram illustrating an embodiment of a digital circuit for producing digital delay signals, such as SDQ1 and SDQ0, for controlling a DCO in accordance with the invention. This circuit operates substantially in accordance with the truth-table illustrated in FIG. 10. It will, of course, be appreciated that a DCO in accordance with the invention is not limited to using digital delay signals produced by the digital circuit embodiment illustrated. As illustrated, an increment or decrement signal is provided. For this embodiment, these signals are synchronous with the output signal of the DCO. A flip-flop, such as 15, 25, 35 and 45, is employed to ensure that the digital delay signal provided has a pulse width of approximately only one cycle of the reference clock. For each flip-flop, this is accomplished by the feedback signal provided from the inverting output port of the flip-flop to the logic AND gate that is coupled to the data port of that flip-flop. Thus, as illustrated, each flip-flop has an associated AND gate, such as gates 10, 20, 30 and 40. Likewise, the output digital pulse signal and inverted output digital pulse signal of the edge delay oscillators, such as 100 and 200 in FIG. 1, are employed to ensure that the digital delay signal provided is properly synchronized or aligned with either the rising edge or falling edge of the digital oscillator pulse having an edge delayed. Logic gates 50, 55, 65 and 70 and logic gates 60, 75, 80, and 85 operate, in effect, to multiplex the digital delay signals provided by flip-flops 15, 25, 35, and 45. A signal provided to effect this multiplexing operation is designated "token" in FIG. 11. This token signal is produced by flip-flop 87 which is configured to sense the phase relationship of digital oscillator signal Q1 relative to digital oscillator signal Q0 and provide a "high" or "low" digital signal depending on the digital oscillator signal leading in phase. This "token" signal in conjunction with the increment/decrement signal effectively controls the multiplexing operation applied to produce the desired digital delay signal.

A DCO in accordance with the invention, such as the embodiment illustrated in FIG. 1, may be operated in accordance with the following method to reduce the phase quantization of a digital output signal. A first series of digital pulses may be produced at a substantially predetermined frequency, such as by edge delay oscillator 100 illustrated in FIG. 1. Each of the digital pulses has a rising edge and a failing edge. Likewise, edge delay oscillator 200 may be employed to produce a second series of digital pulses at the substantially predetermined frequency, this second series being out of phase with respect to the first series. The second series may be out of phase with respect to the first series by varying amounts of phase or delay, depending, for example, upon the duty cycle of the reference clock pulses. For the embodiment illustrated in FIG. 1, the series are out of phase by approximately one-quarter period of the predetermined frequency of the series. Likewise, one of the edges of at least one of the digital pulses in either the first or second series may be delayed by one-half period of the predetermined frequency, such as in response to a phase adjustment or digital delay signal, to produce a series of pulses including at least one edge-delayed pulse. For the embodiment illustrated in FIG. 1, this phase adjustment or digital delay signal may comprise either an increment or a decrement signal that signals the delay of an edge of a digital pulse in the first or second series. For example, the rising or falling edge of one of the digital pulses in the first series may be delayed. Likewise, the rising or falling edge of one of the pulses in the second series may be delayed. Regardless of which edge of a digital pulse in either of the series is delayed, that series, including the edge-delayed pulse, may then be combined with the other series of digital pulses to thereby provide the digital output signal having reduced phase quantization. For example, for the embodiment illustrated in FIG. 1, the two series of digital pulses may be combined by a logical AND gate or other digital logic device. It will, of course, be appreciated that depending on the convention adopted with respect to the digital logic employed, alternative devices for combining digital logic signals other than a logical AND gate may be employed to combine the digital pulses and thereby reduce the phase quantization of the digital output signal. Likewise, it will, of course, be appreciated that the invention is not restricted in scope to any particular convention regarding the precise form of the signal for a high or a low digital logic signal.

While only certain features of the invention have been illustrated and described herein, many modifications, substitutions, changes or equivalents will now occur to those skilled in the art. For example, a DCO in accordance with the invention may employ a clock having a clock pulse with a duty cycle other than approximately fifty percent. Such an embodiment will have the capability to introduce a phase adjustment smaller than the period of the reference clock in the oscillator, but not necessarily precisely as small as one-half of the period of the reference clock frequency. It is, therefore, to be understood that the appended claims are intended to cover all such modifications and changes as fall within the true spirit of the invention.

I claim:
1. An integrated circuit comprising:
  a digital-controlled oscillator;
  said oscillator including an edge delay oscillator being adapted to produce digital oscillator pulses in response to digital clock pulses, each of said oscillator pulses having a rising edge and a falling edge;

said edge delay oscillator being further adapted to delay at least one of the oscillator pulse edges in response to a delay signal.

2. The integrated circuit of claim 1, wherein said edge delay oscillator comprises a rising-edge-triggered oscillator.

3. The integrated circuit of claim 1, wherein said edge delay oscillator comprises a falling-edge-triggered oscillator.

4. The integrated circuit of claim 2, and further comprising:
a falling-edge-triggered oscillator, said falling-edge-triggered oscillator being adapted to delay at least one of the falling-edge-triggered oscillator pulse edges in response to a digital delay signal; and
a digital logic gate;
the output ports of said oscillators being coupled to the input ports of said gate.

5. The integrated circuit of claim 4, wherein said gate comprises a logical AND gate.

6. A phase-locked loop comprising:
a digital-controlled oscillator;
said oscillator including an edge delay oscillator being adapted to produce digital oscillator pulses in response to digital clock pulses, each of said oscillator pulses having a rising edge and a falling edge;
said edge delay oscillator being further adapted to delay at least one of the oscillator pulse edges in response to a delay signal.

7. The phase-locked loop of claim 6, wherein said edge delay oscillator comprises a rising-edge-triggered oscillator.

8. The phase-locked loop of claim 7, and further comprising:
a falling-edge-triggered oscillator, said falling-edge-triggered oscillator being adapted to delay at least one of the falling-edge-triggered oscillator pulse edges in response to a digital delay signal; and
a digital logic gate;
the output ports of said oscillators being coupled to the input ports of said gate.

9. An electrical circuit comprising:
a digital-controlled oscillator;
said oscillator including a clock having a substantially predetermined frequency;
said oscillator being adapted to produce a digital output signal comprising a series of digital output pulses;
said oscillator being further adapted to modify the digital output signal so that at least one digital output pulse is adjusted in phase relative to the immediately preceding digital output pulse by approximately one-half period of the substantially predetermined frequency.

10. The electrical circuit of claim 9, wherein said at least one digital output pulse is advanced in phase relative to the immediately preceding digital output pulse.

11. The electrical circuit of claim 9, wherein said at least one digital output pulse is delayed in phase relative to the immediately preceding digital output pulse.

12. The electrical circuit of claim 9, wherein said oscillator comprises means for modifying the digital output signal.

13. The electrical circuit of claim 9, where said oscillator comprises at least one edge delay oscillator.

14. The electrical circuit of claim 9, wherein said series of digital output pulses comprises a series of periodic digital output pulses.

15. A method of reducing the phase quantization of a digital output signal, said method comprising the steps of:
producing a first series of digital pulses at a substantially predetermined frequency, each of the first series digital pulses having a rising edge and a falling edge;
producing a second series of digital pulses at the substantially predetermined frequency, each of the second series digital pulses having a rising edge and a falling edge, the second series being out of phase with respect to the first series, one of the edges of at least one of the digital pulses in the second series being delayed by approximately at least one-half period of the substantially predetermined frequency; and
combining the second series including the at least one edge-delayed pulse with the first series to thereby provide the digital output signal.

16. The method of claim 15,
wherein the step of combining comprises combining the second series of digital pulses with the first series of digital pulses by performing a digital logic operation.

17. The method of claim 16, wherein the step of combining by performing a digital logic operation comprises performing a logical AND operation.

18. The method of claim 15,
wherein the step of producing the second series of digital pulses including the at least one edge-delayed pulse comprises producing the second series of digital pulses including at least one falling-edge-triggered edge-delayed pulse.

19. The method of claim 15,
wherein the step of producing the second series of digital pulses including the at least one edge-delayed pulse comprises producing the second series of digital pulses including at least one rising-edge-triggered edge-delayed pulse.

20. The method of claim 15, wherein the step of producing a second series of digital pulses comprises producing a second series of digital pulses approximately one-quarter period of the predetermined frequency out of phase with respect to the first series.

* * * * *